United States Patent
Ma et al.

(10) Patent No.: US 12,105,568 B2
(45) Date of Patent: Oct. 1, 2024

(54) AIRFLOW GUIDE WITH INTEGRATED POWER CONDUCTION

(71) Applicant: Dell Products L.P., Round Rock, TX (US)

(72) Inventors: Xin Zhi Ma, Shanghai (CN); Shi Bing Tai, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/726,877

(22) Filed: Apr. 22, 2022

(65) Prior Publication Data

US 2023/0324966 A1    Oct. 12, 2023

(30) Foreign Application Priority Data

Apr. 6, 2022   (CN) .......................... 202210362623.8

(51) Int. Cl.
*G06F 1/20* (2006.01)
*H05K 5/02* (2006.01)
*H05K 7/20* (2006.01)

(52) U.S. Cl.
CPC .......... *G06F 1/203* (2013.01); *H05K 5/0247* (2013.01); *H05K 7/20145* (2013.01)

(58) Field of Classification Search
CPC ... G06F 1/203; H05K 5/0247; H05K 7/20145
See application file for complete search history.

(56) References Cited

U.S. PATENT DOCUMENTS

| | | | | | |
|---|---|---|---|---|---|
| 5,754,398 | A * | 5/1998 | Glovatsky | ............ | H05K 3/0058 |
| | | | | | 264/249 |
| 6,525,935 | B2 * | 2/2003 | Casebolt | ............ | H05K 7/20736 |
| | | | | | 361/679.48 |
| 6,618,248 | B1 * | 9/2003 | Dalheimer | ................ | G06F 1/18 |
| | | | | | 361/679.33 |
| 7,646,602 | B1 * | 1/2010 | Tamarkin | ........... | H05K 7/20736 |
| | | | | | 361/695 |
| 8,755,176 | B2 * | 6/2014 | Davis | .................... | G11B 33/128 |
| | | | | | 361/679.01 |
| 9,241,427 | B1 * | 1/2016 | Stevens | ................ | G11B 33/142 |
| 10,989,221 | B2 * | 4/2021 | Chen | .................. | H05K 7/20727 |
| 11,402,884 | B1 * | 8/2022 | Nayak | ..................... | G06F 1/185 |
| 11,659,694 | B2 * | 5/2023 | Bryan | ........................ | G06F 1/20 |
| | | | | | 361/679.46 |
| 2005/0259392 | A1 * | 11/2005 | Vinson | ...................... | G06F 1/20 |
| | | | | | 361/679.47 |
| 2005/0259393 | A1 * | 11/2005 | Vinson | ...................... | G06F 1/20 |
| | | | | | 165/80.3 |
| 2006/0039108 | A1 * | 2/2006 | Chikusa | .................... | G06F 1/20 |

(Continued)

*Primary Examiner* — Michael A Matey
(74) *Attorney, Agent, or Firm* — Jackson Walker L.L.P.

(57) ABSTRACT

An information handling system may include a heat-generating information handling resource, an air mover, a power supply unit, and an airflow guide. The airflow guide may include one or more features configured to, either alone or in combination with portions of a chassis of the information handling system, form an air plenum fluidically coupled between the air mover and the heat-generating information handling resource and electrical conduits integrated within the airflow guide configured to deliver electrical current from the power supply unit to the heat-generating information handling resource.

9 Claims, 2 Drawing Sheets

(56) References Cited

U.S. PATENT DOCUMENTS

| | | | |
|---|---|---|---|
| 2007/0076370 A1* | 4/2007 | Mongia | H05K 7/20145 361/690 |
| 2008/0117590 A1* | 5/2008 | Dey | G06F 1/20 361/679.5 |
| 2008/0148303 A1* | 6/2008 | Okamoto | G11B 33/142 |
| 2008/0174948 A1* | 7/2008 | Davis | G11B 33/127 |
| 2008/0239656 A1* | 10/2008 | Sasagawa | G11B 33/142 |
| 2008/0239665 A1* | 10/2008 | Franz | F04D 29/664 417/423.15 |
| 2008/0266792 A1* | 10/2008 | Li | H05K 7/20909 361/695 |
| 2009/0016016 A1* | 1/2009 | Moss | H05K 7/20736 361/692 |
| 2011/0249414 A1* | 10/2011 | Krancher | H05K 1/183 361/752 |
| 2013/0265713 A1* | 10/2013 | Crane | G06F 1/185 361/679.51 |
| 2014/0362523 A1* | 12/2014 | Degner | H05K 7/20009 361/679.47 |
| 2014/0364048 A1* | 12/2014 | Milligan | H05K 7/20736 454/184 |
| 2015/0305206 A1* | 10/2015 | Fukuda | G11B 33/142 361/679.49 |
| 2016/0037687 A1* | 2/2016 | Stevens | G11B 33/142 361/679.48 |
| 2016/0095246 A1* | 3/2016 | Noland | H05K 7/1489 361/752 |
| 2016/0324032 A1* | 11/2016 | Davis | G11B 33/142 |
| 2017/0187263 A1* | 6/2017 | Yamamoto | H05K 7/20918 |
| 2017/0202111 A1* | 7/2017 | Huang | H05K 7/1487 |
| 2017/0273214 A1* | 9/2017 | Casparian | G06F 1/203 |
| 2018/0356112 A1* | 12/2018 | Lin | G05B 15/02 |
| 2020/0196487 A1* | 6/2020 | Mann | H05K 7/20181 |
| 2022/0240409 A1* | 7/2022 | Doglio | H04M 1/0277 |
| 2023/0105368 A1* | 4/2023 | Sharf | H01R 13/6587 439/78 |

\* cited by examiner

AIRFLOW GUIDE WITH INTEGRATED POWER CONDUCTION

TECHNICAL FIELD

The present disclosure relates in general to information handling systems, and more particularly to an airflow guide with integrated electrical conduits for power conduction, for use in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

As information handling system servers become more dense, optimization of the space within a server chassis and effective heat dissipation from the server chassis become more and more challenging. High-density designs require high power consumption and higher signal speeds, all of which lead to increased heat generation, and all of which present challenges for routing electrical conduits for delivery of electrical energy and electrical signals. Existing approaches for delivery of electrical energy include use of power cables and/or bus bars, all of which take significant space in a chassis, and may negatively affect airflow impedance to air driven by air movers, which may reduce effectiveness of thermal management systems. Another approach may include use of multiple power layers or a wider power plane within a motherboard, which may lead to design complexity and limit signal routing within the motherboard.

SUMMARY

In accordance with the teachings of the present disclosure, the disadvantages and problems associated with traditional approaches to routing electrical conduits within an information handling chassis may be substantially reduced or eliminated.

In accordance with embodiments of the present disclosure, an information handling system may include a heat-generating information handling resource, an air mover, a power supply unit, and an airflow guide. The airflow guide may include one or more features configured to, either alone or in combination with portions of a chassis of the information handling system, form an air plenum fluidically coupled between the air mover and the heat-generating information handling resource and electrical conduits integrated within the airflow guide configured to deliver electrical current from the power supply unit to the heat-generating information handling resource.

In accordance with these and other embodiments of the present disclosure, an airflow guide may include one or more features configured to, either alone or in combination with portions of a chassis of an information handling system, form an air plenum fluidically coupled between the air mover and the heat-generating information handling resource and electrical conduits integrated within the airflow guide configured to deliver electrical current from a power supply unit of the information handling system to the heat-generating information handling resource.

In accordance with these and other embodiments of the present disclosure, a method may include fluidically coupling an air plenum formed at least in part by mechanical features of an airflow guide between an air mover and a heat-generating information handling resource of an information handling system and electrically coupling electrical conduits integrated within the airflow guide between a power supply unit of the information handling system and the heat-generating information handling resource such that electrical conduits deliver electrical current from the power supply unit to the heat-generating information handling resource.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
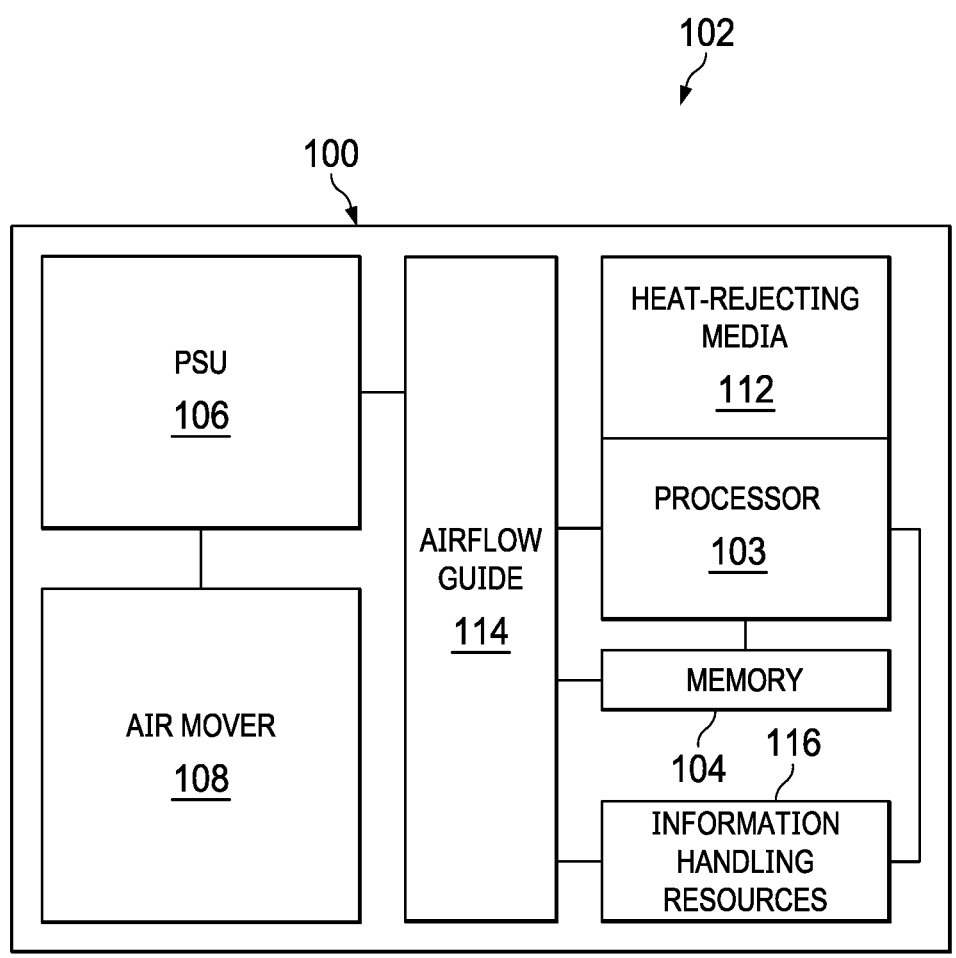
FIG. 1 illustrates a block diagram of an example information handling system, in accordance with embodiments of the present disclosure.
Figure 2:
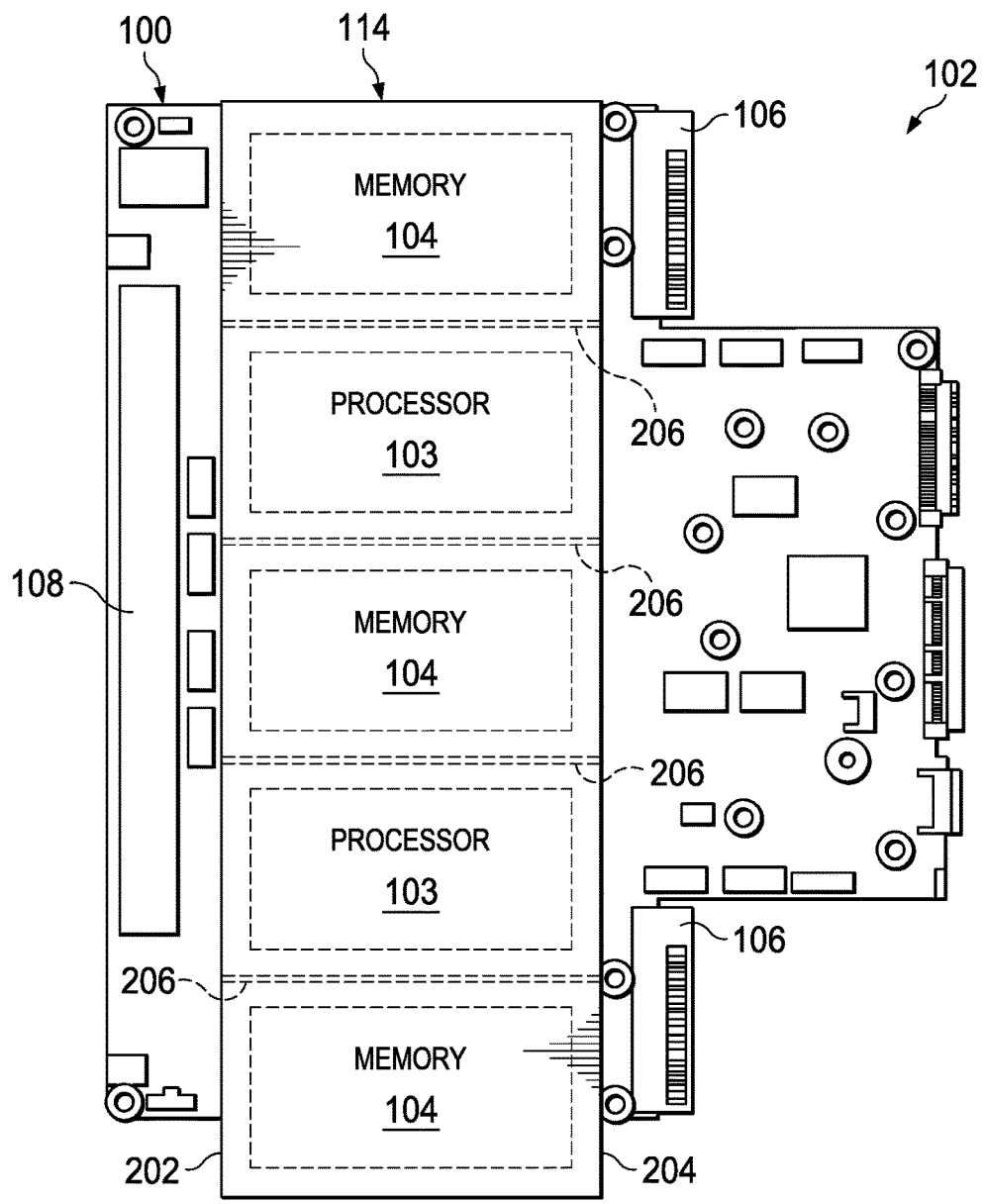
FIG. 2 illustrates a top plan view of selected components of an example information handling system with a portion of a chassis removed, in accordance with embodiments of the present disclosure.
Figure 3:
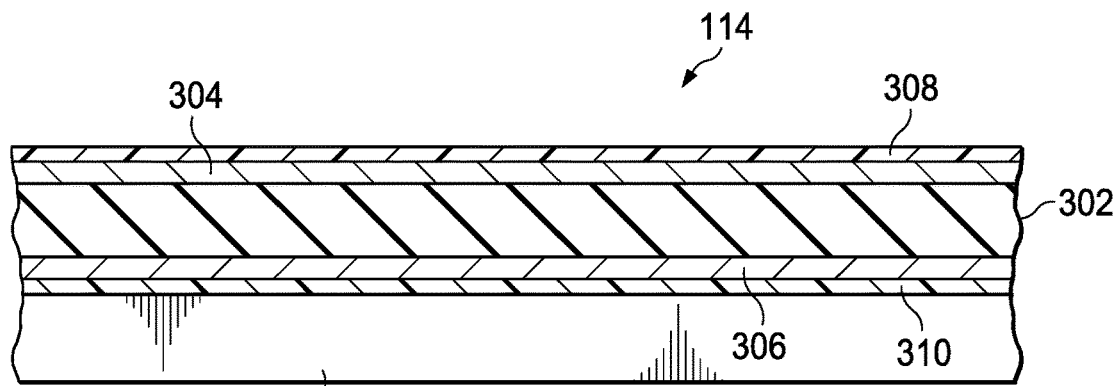
FIG. 3 illustrates a side cross-sectional elevation view of selected components of an example airflow guide, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a server. In other embodiments, information handling system 102 may be a personal computer (e.g., a desktop computer, a laptop, notebook, tablet, handheld, smart phone, personal digital assistant, etc.). As depicted in FIG. 1, information handling system 102 may include a chassis 100 housing a plurality of information handling resources including, without limitation, processor 103, a memory 104 communicatively coupled to processor 103, a power supply unit (PSU) 106, an air mover 108, heat-rejecting media 112 thermally coupled to processor 103, information handling resources 116 communicatively coupled to processor 103, and an airflow guide 114 fluidically coupled between air mover 108 and heat-generating components of chassis 100 (e.g., processor 103 and memory 104) and electrically coupled to PSU 106, processor 103, and memory 104.

Chassis 100 may comprise an enclosure that serves as a container for various information handling systems and/or information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Generally speaking, PSU 106 may include any system, device, or apparatus configured to supply electrical current to one or more information handling resources of information handling system 102, to provide electrical energy needed for functioning of such information handling resources.

An air mover 108 may include any mechanical or electro-mechanical system, apparatus, or device operable to move air and/or other gases. In some embodiments, an air mover 108 may comprise a fan (e.g., a rotating arrangement of vanes or blades which act on the air). In other embodiments, an air mover 108 may comprise a blower (e.g., a centrifugal fan that employs rotating impellers to accelerate air received at its intake and change the direction of the airflow). In these and other embodiments, rotating and other moving components of air mover 108 may be driven by a motor. The rotational speed of such motor may be controlled by suitable control signals communicated from processor 103 or a controller of air mover 108 in communication with processor 103. In operation, air mover 108 may cool information handling resources of information handling system 102 by drawing cool air into enclosure 100, expelling warm air from inside the enclosure to the outside of such enclosure, and/or move air across heat-rejecting media 112 internal to enclosure 100 to cool one or more information handling resources (e.g., processor 103).

Heat-rejecting media 112 may include any system, device, or apparatus configured to transfer heat from an information handling resource, thus reducing a temperature of the information handling resource. For example, heat-rejecting media 112 may include a fluid conveyed proximate to an information handling resource (e.g., air conveyed by a fan or blower, liquid conveyed via a liquid conduit by a pump, etc.), or a solid thermally coupled to the information handling resource (e.g., heatpipe, heat spreader, heatsink, finstack, etc.).

Generally speaking, information handling resources 116 may include any component system, device or apparatus of information handling system 102, including without limitation processors, graphics processing units, buses, computer-readable media, input-output devices and/or interfaces, storage resources, network interfaces, motherboards, electromechanical devices (e.g., fans), displays, and/or power supplies.

Airflow guide 114 may comprise any suitable mechanical structure fluidically coupled between air mover 108 and heat-generating components of chassis 100 (e.g., processor 103, memory 104, and/or information handling resources 116) and configured to guide airflow driven by air mover 108 proximate to such heat-generating components and/or heat-rejecting media (e.g., heat-rejecting media 112) thermally coupled to such heat-generating component, to enable transfer of heat from such heat-generating components and/or heat-rejecting media to the airflow. Further, as described in greater detail below, airflow guide 114 may have electrical conduits integrated within and may be electrically interfaced between PSU 106 and one or more information handling resources (e.g., processor 103, memory 104, and/or information handling resources 116) in order to conduct electrical energy to such one or more information handling resources.

In addition to processor 103, memory 104, PSU 106, air mover 108, heat-rejecting media 112, information handling resources 116, and airflow guide 114, information handling system 102 may include one or more other information handling resources.

FIG. 2 illustrates a top plan view of selected components of an example information handling system 102 with a portion of chassis 100 removed, in accordance with embodiments of the present disclosure. As shown in FIG. 2, airflow guide 114 may be placed in chassis 100 between PSU 106 and air movers 108 on one hand, and processor 103, memory 104, and other components of information handling system 102 on the other hand. As also shown in FIG. 2, airflow guide 114 may have a first side 202 proximate to PSU 106 and air movers 108 and a second side 204 proximate to processor 103 and memory 104. First side 202 may have electrically coupled thereto one or more suitable connectors (not explicitly shown) for coupling electrical conduits integrated within airflow guide 114 to a backplane, power delivery board, or other circuit board to which PSU 106 is mounted or otherwise electrically coupled. Similarly, second side 204 may have electrically coupled thereto one or more suitable connectors (not explicitly shown) for coupling electrical conduits integrated within airflow guide 114 to a motherboard or other circuit board to which processor 103, memory 104, and/or other information handling resources are mounted or otherwise electrically coupled. Such connectors may include any suitable connectors now known or someday known in the art, including without limitation a copper plate bus bar or a cable connector (e.g., RADSOK cable connector). Further, airflow guide 114 may have one or more walls 206 arranged in parallel with the direction of desired airflow, such that walls 206 either alone or in concert with portions of chassis 100 define one or more air plenums arranged to guide flow of air driven by air mover 108 from air mover 108, through such one or more air plenums, and proximate to processor 103, memory 104, and/or information handling resources 116.

FIG. 3 illustrates a side cross-sectional elevation view of selected components of an example airflow guide 114, in accordance with embodiments of the present disclosure. As shown in FIG. 3, airflow guide 114 may have an insulative core 302 formed from plastic or other electrically-insulative material. A first electrically-conductive layer 304 of conductive material (e.g., copper) may be formed on a top of insulative core 302 and a second electrically-conductive layer 306 of conductive material (e.g., copper) may be formed on a bottom of insulative core 302. A first electrically-insulating layer 308 of insulating material (e.g., plastic) may be formed over first electrically-conductive layer 304 and a second electrically-insulating layer 310 of insulating material (e.g., plastic) may be formed below second electrically-conductive layer 306. Accordingly, in operation, airflow driven by air mover 108 may flow through and be guided by airflow guide 114, while electrical current from PSU 106 may be delivered via one of the electrically-conductive layers 304, 306 and electrical current may return to PSU 106 via the other of electrically-conductive layers 304, 306.

Although FIG. 3 depicts a particular arrangement of elements for airflow guide 114, it is understood that other arrangements of such elements may be made. For example, in some embodiments, first electrically-conductive layer 304 of conductive material may be formed on top of insulative core 302, with first electrically-insulating layer 308 formed on top of first electrically-conductive layer 304, second electrically-conductive layer 306 formed on top of first electrically-insulating layer 308, and second electrically-insulating layer 310 formed on top of second electrically-conductive layer 306.

Advantageously, airflow guide 114 may enable directed airflow within chassis 100, while minimizing presence of electrical conduits (e.g., cables) in the airflow path, and while also minimizing the presence of power and ground conductors in a backplane, motherboard, or other circuit board located below airflow guide 114.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a heat-generating information handling resource;
   an air mover to produce airflow in a desired direction;
   a power supply unit; and
   an airflow guide comprising:
      one or more walls, arranged in parallel with the desired direction of airflow, configured to, either alone or in combination with portions of a chassis of the information handling system, form an air plenum fluidically coupling the air mover and the heat-generating information handling resource;
      a layered structure, overlying the one or more walls, wherein the layered structure includes first and second electrically conductive-layers and an insulative layer between the first and second electrically conductive layers, integrated within the airflow guide configured to deliver electrical current from the power supply unit to the heat-generating information handling resource;
      integrated electrical conduits; and
      one or more connectors for coupling the integrated electrical conduits to a motherboard to which the heat generating information handling resource is mounted.

2. The information handling system of claim 1, further comprising:
   a first connector configured to couple the first and second electrically conductive layers to a first circuit board to which the power supply unit is electrically coupled; and
   a second connector configured to couple the first and second electrically conductive layers to a second circuit board to which the heat-generating information handling resource is electrically coupled.

3. The information handling system of claim 1 wherein the layered structure includes a first insulative layer between the first and second conductive layers, a second insulative layer.

4. The information handling system of claim 1, wherein the one or more connectors for coupling the integrated electrical conduits to a motherboard comprise a copper plate bus bar.

5. The information handling system of claim 1, wherein the one or more connectors for coupling the integrated electrical conduits to a motherboard include a RADSOK connector.

6. An airflow guide comprising:
   one or more walls, arranged in parallel with the desired direction of airflow, configured to, either alone or in combination with portions of a chassis of an information handling system, form an air plenum fluidically coupled between an air mover configured to produce airflow in a desired direction and a heat-generating information handling resource; and
   a layered structure, overlying the one or more walls, wherein the layered structure includes first and second electrically conductive layers and an insulative layer between the first and second electrically conductive layers, integrated within the airflow guide configured to deliver electrical current from a power supply unit of the information handling system to the heat-generating information handling resource;
   integrated electrical conduits; and
   one or more connectors for coupling the integrated electrical conduits to a motherboard to which the heat generating information handling resource is mounted.

7. The airflow guide of claim 6, further comprising:
   a first connector configured to couple the first and second electrically conductive layers to a first circuit board to which the power supply unit is electrically coupled; and
   a second connector configured to couple the first and second electrically conductive layers to a second circuit board to which the heat-generating information handling resource is electrically coupled.

8. The airflow guide of claim 6, wherein the one or more connectors for coupling the integrated electrical conduits to a motherboard comprise a copper plate bus bar.

9. The airflow guide of claim 6, wherein the one or more connectors for coupling the integrated electrical conduits to a motherboard include a RADSOK connector.

* * * * *